(12) United States Patent
Kang et al.

(10) Patent No.: US 6,490,189 B1
(45) Date of Patent: Dec. 3, 2002

(54) BOOST VOLTAGE GENERATING CIRCUIT FOR NONVOLATILE FERROELECTRIC MEMORY DEVICE AND METHOD FOR GENERATING BOOST VOLTAGE

(75) Inventors: Hee Bok Kang, Daejon-Kwangyokshi (KR); Hun Woo Kye, Kyonggido (KR); Duck Ju Kim, Chejudo (KR); Je Hoon Park, Kyonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/036,369

(22) Filed: Jan. 7, 2002

(30) Foreign Application Priority Data

May 28, 2001 (KR) .......................................... 01-29466

(51) Int. Cl.[7] .............................................. G11C 11/22
(52) U.S. Cl. ........................................ 365/145; 365/226
(58) Field of Search ................................ 365/145, 149, 365/65, 226, 230.06, 189.09, 189.11; 327/536, 534; 307/109, 110

(56) References Cited

U.S. PATENT DOCUMENTS

| | | | |
|---|---|---|---|
| 5,598,366 A | 1/1997 | Kraus et al. ................. | 365/145 |
| 5,724,283 A | 3/1998 | Tai .............................. | 365/145 |
| 5,774,392 A | * 6/1998 | Kraus et al. ................. | 327/589 |
| 6,031,754 A | 2/2000 | Derbenwick et al. ....... | 365/145 |
| 6,275,425 B1 | * 8/2001 | Eliason ....................... | 327/530 |

FOREIGN PATENT DOCUMENTS

| | | |
|---|---|---|
| JP | 7-182872 | 7/1995 |
| JP | 8-273374 | 10/1996 |
| JP | 11-176169 | 7/1999 |

* cited by examiner

*Primary Examiner*—Michael S. Lebentritt
*Assistant Examiner*—Anh Phung
(74) *Attorney, Agent, or Firm*—Morgan, Lewis & Bockius LLP

(57) ABSTRACT

A boost voltage generating circuit and method for a nonvolatile ferroelectric memory device is disclosed in the present invention. The present invention provides a stable operation when a power source supply voltage region is in a wide power source voltage region, and a layout area for generating a boost voltage is reduced, thereby reducing a chip cost.

26 Claims, 15 Drawing Sheets

BOOST VOLTAGE GENERATING CIRCUIT FOR NONVOLATILE FERROELECTRIC MEMORY DEVICE AND METHOD FOR GENERATING BOOST VOLTAGE

This application claims the benefit of Korean Application No. P2001-29466 filed on May 28, 2001, which is hereby incorporated by reference.

BACKGROUND OF THE INVENTION

1. Field of the Invention

The present invention relates to a semiconductor device, and more particularly, to a boost voltage generating circuit for a nonvolatile ferroelectric memory device and method of generating a boost voltage. Although the present invention is suitable for a wide scope of applications, it is particularly suitable for operating a nonvolatile ferroelectric memory device at a low voltage.

2. Discussion of the Related Art

Generally, a nonvolatile ferroelectric memory (i.e., a ferroelectric random access memory (FRAM)) has a data processing speed substantially the same as a dynamic random access memory (DRAM) and is able to retain data even in power off. For this reason, the nonvolatile ferroelectric memory has received much attention as a next generation memory device.

The FRAM and the DRAM are memory devices having similar structures. The FRAM, however, includes a ferroelectric capacitor having a high residual polarization characteristic. The residual polarization characteristic permits data to be maintained even if an electric field is removed.

FIG. 1 shows a hysteresis loop of a typical ferroelectric. As shown in FIG. 1, even if a polarization induced by the electric field has the electric field removed, data is maintained at a certain amount (i.e., "d" and "a" states in FIG. 1) due to the presence of the residual polarization (or spontaneous polarization). A nonvolatile ferroelectric memory device utilizes the "d" and "a" states corresponding to "1" and "0", respectively.

A related art nonvolatile ferroelectric memory device will now be described. FIG. 2 shows a unit cell of a related art nonvolatile ferroelectric memory.

As shown in FIG. 2, the related art nonvolatile ferroelectric memory includes a bitline B/L formed in one direction, a wordline W/L formed to cross the bitline, a plate line P/L spaced apart from the wordline in the same direction as the wordline, a transistor Ti with a gate connected to the wordline and a source connected to the bitline, and a ferroelectric capacitor FC1. A first terminal of the ferroelectric capacitor FC1 is connected to a drain of the transistor T1 and a second terminal is connected to the plate line P/L.

Data input/output operation of the related art nonvolatile ferroelectric memory device&will now be described as follows. FIG. 3A is a timing chart illustrating operation of a write mode of the related art nonvolatile ferroelectric memory device, while FIG. 3B is a timing chart illustrating operation of a read mode thereof.

During the write mode, an externally applied chip enable signal CSBpad is activated from high state to low state. At the same time, if a write enable signal WEBpad is applied from high state to low state, the write mode starts. Subsequently, if an address decoding in the write mode starts, a pulse applied to the corresponding wordline is transited from low state to high state to select a cell.

High and low signals in a certain period are sequentially applied to the corresponding plate line in a period where the wordline is maintained at high state. To write a logic value "1" or "0" in the selected cell, a high signal or low signal synchronized with the write enable signal WEBpad is applied to the corresponding bitline.

In other words, if a high signal is applied to the bitline and the low signal is applied to the plate line in a period where the signal applied to the wordline is High, a logic value "1" is written in the ferroelectric capacitor. Conversely, if a low signal is applied to the bitline and the signal applied to the plate line is high, a logic value "0" is written in the ferroelectric capacitor.

Reading operation of data stored in a cell by the above the write mode operation will now be described as follows. If an externally applied chip enable signal CSBpad is activated from high state to low state, all of the bitlines become equipotential to a low voltage by an equalizer signal EQ before the corresponding wordline is selected.

Then, the respective bitline becomes inactive and an address is decoded. The low signal is transited to the high signal in the corresponding wordline according to the decoded address so that the corresponding cell is selected.

The high signal is applied to the plate line of the selected cell to destroy the data corresponding to the logic value "1" stored in the ferroelectric memory. If the logic value "0" is stored in the ferroelectric memory, the corresponding data is not destroyed.

The destroyed data and the undestroyed data are output as different values shown in the ferroelectric hysteresis loop, so that a sensing amplifier senses the logic value "1" or "0", respectively. In other words, if the data is destroyed, the "d" state is transited to the "f" state, as shown in the hysteresis loop of FIG. 1. If the data is not destroyed, the "a" state is transited to the "f" state. Thus, if the sensing amplifier is enabled after a set time has elapsed, the logic value "1" is output in case that the data is destroyed while the logic value "0" is output in case that the data is not destroyed.

As described above, after the sensing amplifier outputs the data to recover the original data, the plate line becomes inactive from high state to low state at the state that the high signal is applied to the corresponding wordline.

When the data reading/writing operation is executed, a boost voltage can be generated in the wordline by using an NMOS capacitor (not shown).

However, the related art nonvolatile ferroelectric memory device has several problems as follows.

Since a boost voltage is not used when the cell is read and written, an error operation may occur in a low voltage region. Also, since an NMOS transistor should be used to generate the boost voltage, more layout areas are required.

SUMMARY OF THE INVENTION

Accordingly, the present invention is directed to a boost voltage generating circuit for a nonvolatile ferroelectric memory device and method of generating the boost voltage that substantially obviates one or more of problems due to limitations and disadvantages of the related art.

Another object of the present invention is to provide a boost voltage generating circuit for a nonvolatile ferroelectric memory device and method of generating a boost voltage in which an operation is stable when a power source supply voltage region is within a wide power source voltage region.

Another object of the present invention is to provide a boost voltage generating circuit for a nonvolatile ferroelectric memory device and method of generating a boost voltage in which a layout area for generating the boost voltage is reduced, thereby reducing a chip cost.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a boost voltage generating circuit for a nonvolatile ferroelectric memory device includes a supply voltage sensor receiving a voltage boost control signal and determining whether a power source voltage is less than a threshold voltage, a first operation unit receiving an output signal of the supply voltage sensor and the voltage boost control signal and performing a first logic operation, first and second signal output units receiving an output signal of the first operation unit and delaying start and end edges of the voltage boost control signal, thereby outputting first and second boost control signals, and a voltage generating circuit having a ferroelectric capacitor that receives an active signal of an address decoder and the first and second boost control signals when the power source voltage is less than the threshold voltage, thereby generating a boost voltage higher than the power source voltage.

In another aspect of the present invention, a boost voltage generating method for a nonvolatile ferroelectric memory device according to the present invention includes outputting a voltage boost control signal when a chip enable signal is activated in a region where a power source voltage is less than a threshold voltage, delaying start and end edges of the voltage boost control signal to output first and second boost control signals, and inputting the first and second boost control signals into a boost voltage generating circuit having a ferroelectric capacitor to generate a boost voltage higher than the power source voltage.

In a further aspect of the present invention, a boost voltage generating method for a nonvolatile ferroelectric memory device according to the present invention includes outputting a wordline boost control signal of high level having a first width when a chip enable signal is activated and a power source voltage is less than a threshold voltage, delaying only a start edge of the wordline boost control signal to output a first boost control signal, outputting the first boost control signal and at the same time delaying/ extending a width equivalent to an end edge of the boost control signal to output a second boost control signal, and inputting an active signal of an address decoder and the first and second boost control signals in a boost voltage generating circuit having a ferroelectric capacitor to generate a boost voltage higher than the power source voltage.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings.

DETAILED DESCRIPTION OF THE ILLUSTRATED EMBODIMENTS

Reference will now be made in detail to the illustrated embodiments of the present invention, examples of which are illustrated in the accompanying drawings. Wherever possible, the same reference numbers will be used throughout the drawings to refer to the same or like parts.

A boost voltage generating circuit for a nonvolatile ferroelectric memory device and method of generating a boost voltage according to the present invention will be described with reference to the accompanying drawings.

By practicing the present invention, an FRAM memory cell is stably operated when a power source voltage region is within a wide power source voltage region.

In the present invention, the wide power source voltage region is divided into a low voltage region and a normal voltage region.

In the low voltage region, a voltage higher than a power source voltage VCC is generated. The generated voltage is supplied to a wordline of a cell as well as a self-boost NMOS transistor of a wordline driver, so that the cell is stably operated by a boosted wordline signal.

Particularly, a voltage is boosted using a ferroelectric capacitor in generating a boost voltage, so that an area of the boost capacitor is significantly reduced. This reduces in turn a layout area and a chip cost.

The boost voltage generating circuit supplies a wordline control signal to a wordline of a cell array block through a level shifter and a wordline driver, or transmits the wordline control signal to a gate of a self-boost NMOS transistor of the wordline driver.

In the normal voltage region, a supplied voltage is provided to operate a cell without any further process, so that a CMOS device is prevented from being deteriorated due to a high voltage.

Figure 1:
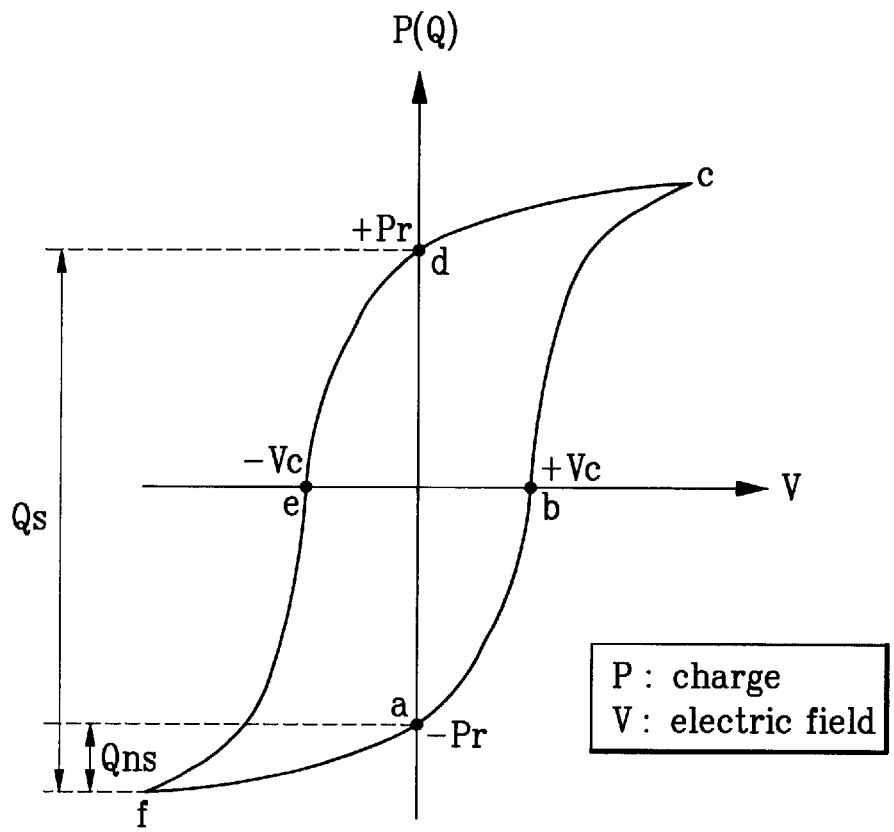
FIG. 1 shows a hysteresis loop of a typical ferroelectric.
Figure 2:
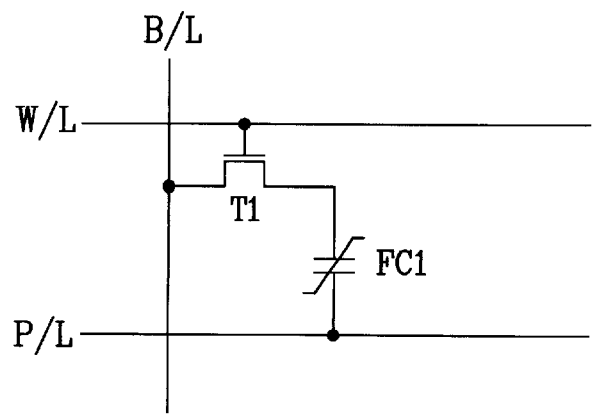
FIG. 2 is a schematic view of a unit cell of a related art nonvolatile ferroelectric memory device.
Figure 3A:
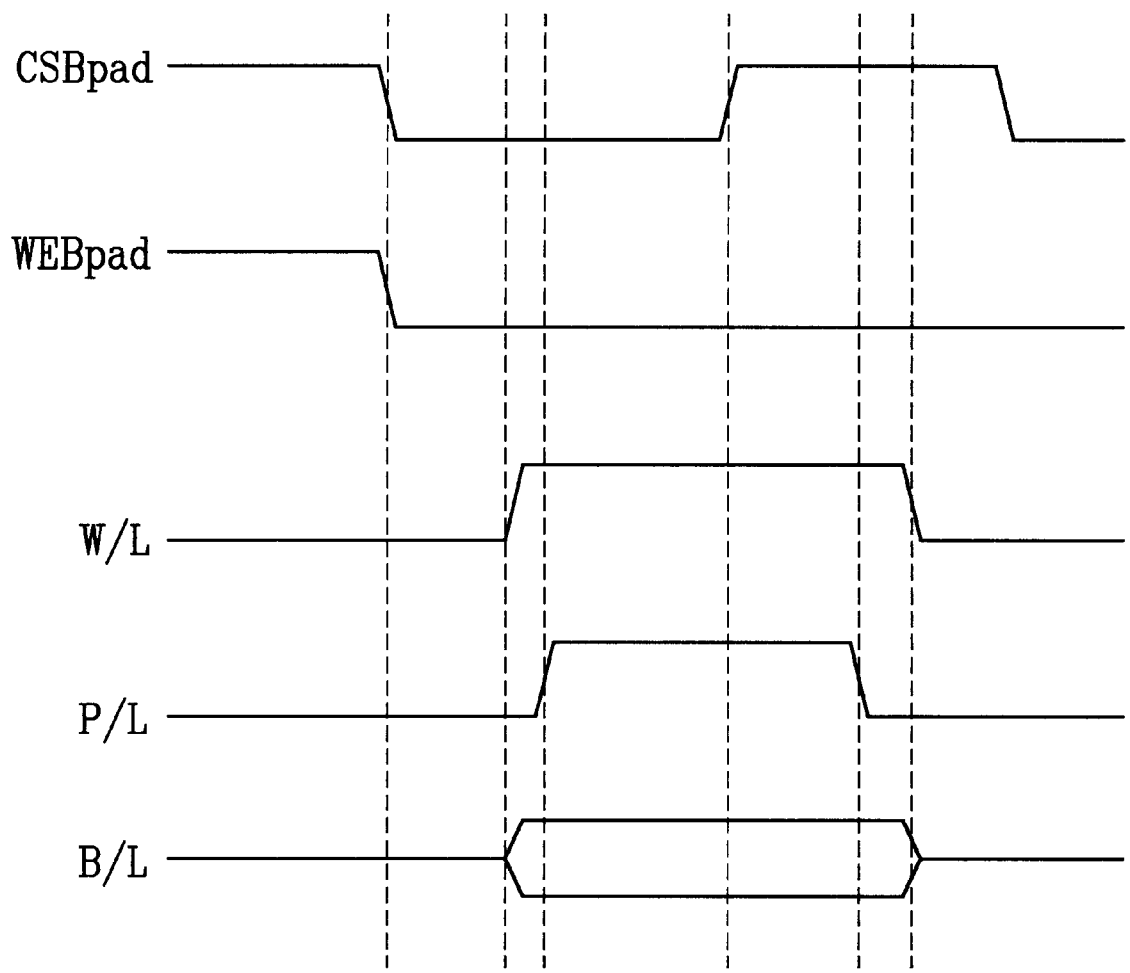
FIG. 3A is a timing chart illustrating a write mode operation of the related art nonvolatile ferroelectric memory device.
Figure 3B:
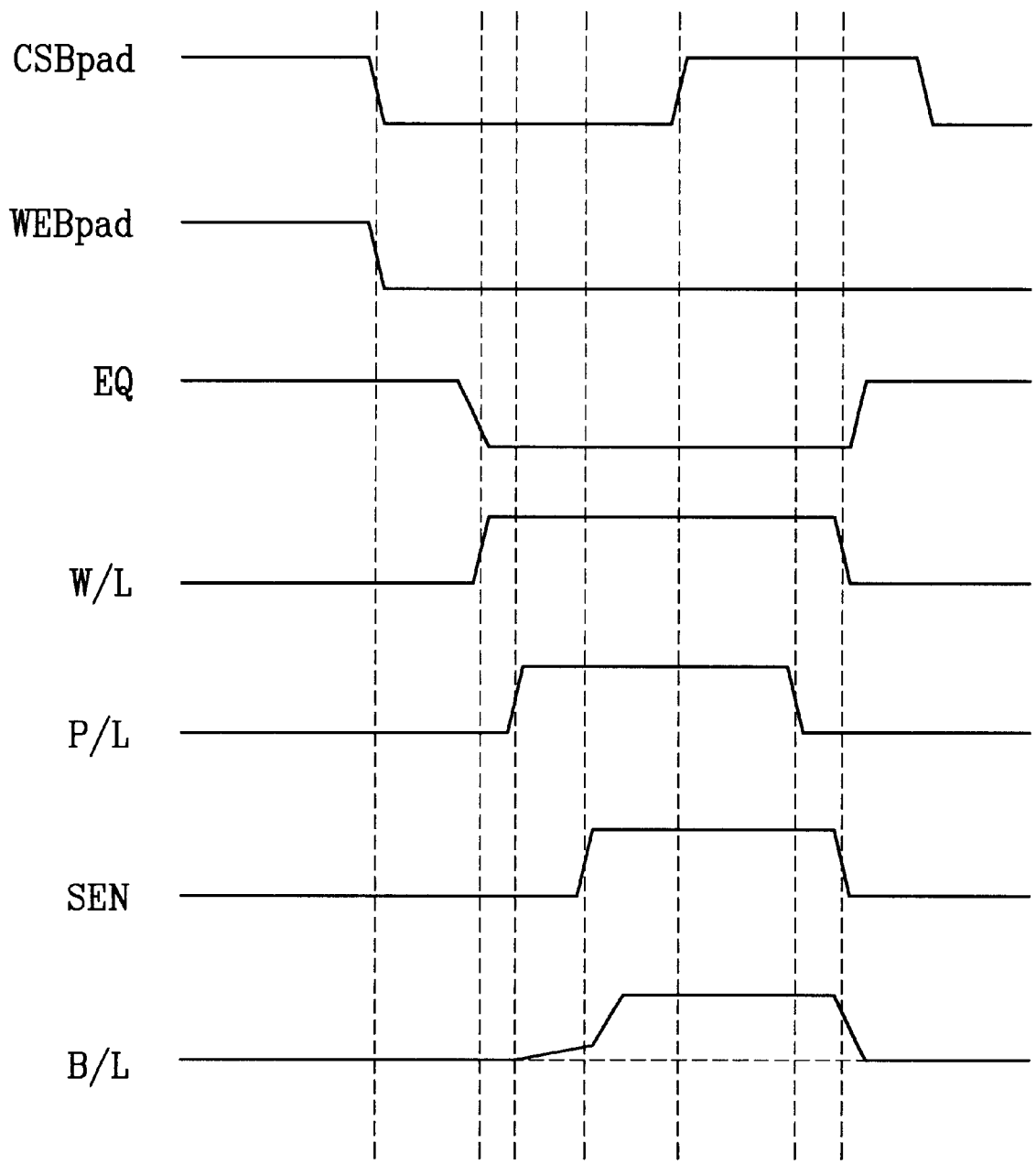
FIG. 3B is a timing chart illustrating a read mode operation of the related art nonvolatile ferroelectric memory device.
Figure 4:
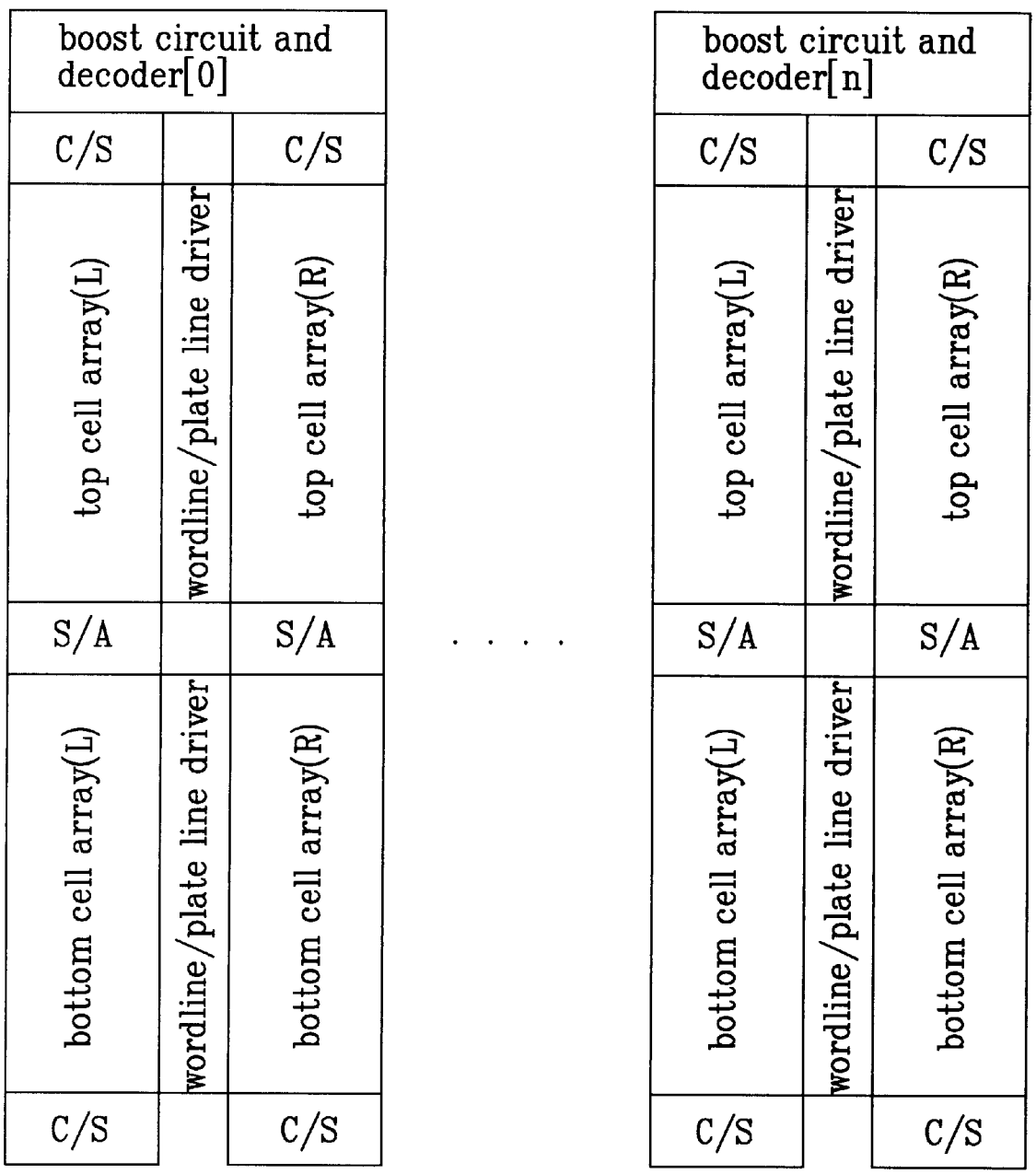
FIG. 4 is a layout of a cell array of a nonvolatile ferroelectric memory device for a driving method according to the present invention.
Figure 5:
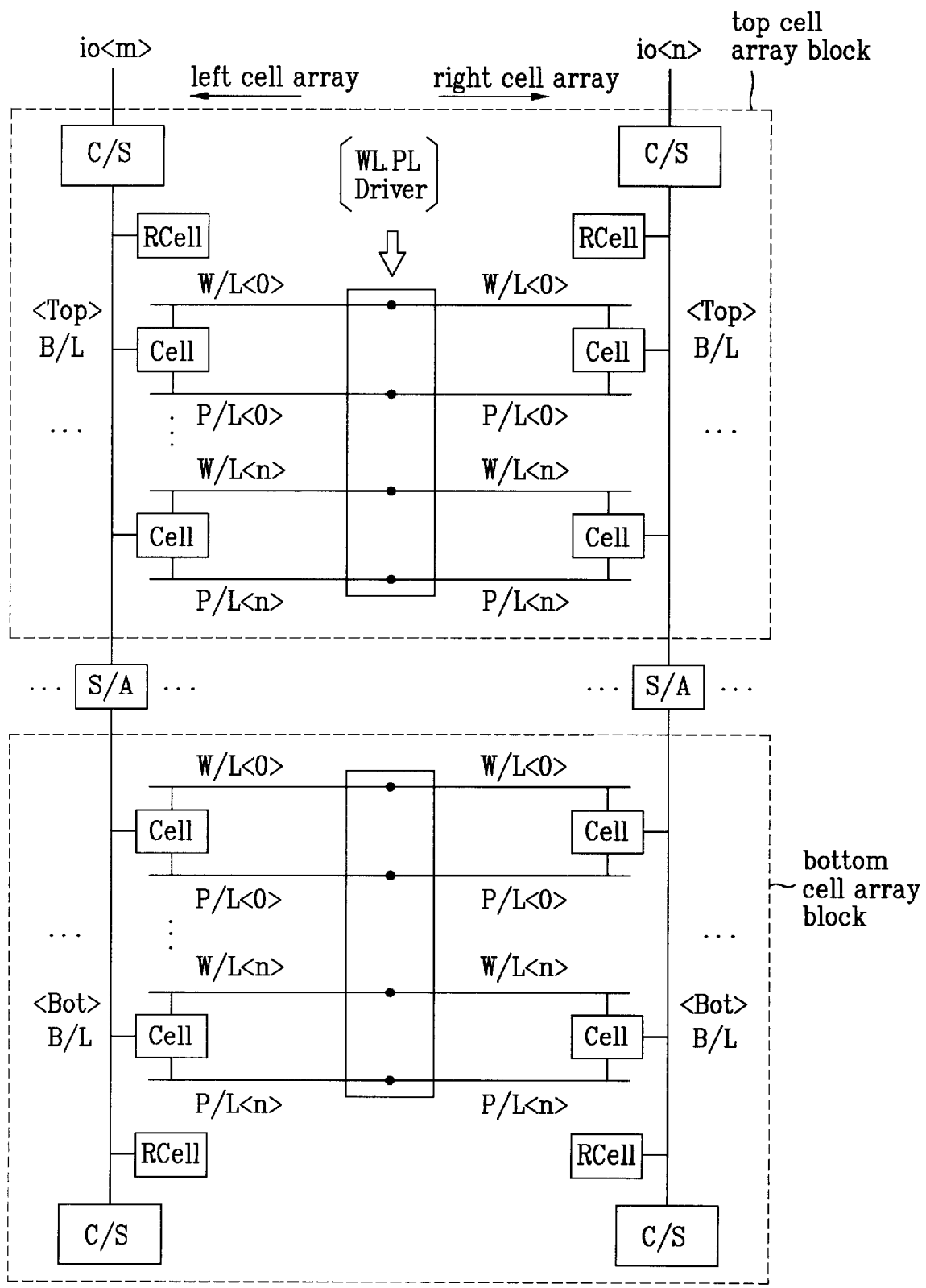
FIG. 5 is a circuit diagram of the cell array of FIG. 4.

A cell array block for a driving method of the present invention is shown in FIGS. 4 and 5.

The cell array block includes a plurality of top cell array blocks and a plurality of bottom cell array blocks. A sensing amplifier S/A is formed between adjacent top and bottom cell array blocks per bitline.

A column-selector C/S is connected to a data bus at one end of each bitline. A reference cell RCell (not shown) is arranged in a portion adjacent to the column selector S/A of each top cell array block and each bottom cell array block. A plurality of cells are arranged in a bitline between the reference cell RCell and the sensing amplifier S/A.

The respective top and bottom cell array blocks are arranged at both sides based on the wordline/plate line drivers.

That is, the top cell array block is divided into a left top cell array L and a right top cell array R while the bottom cell array block is divided into a left bottom cell array L and a right bottom cell array R.

At this time, the wordline driver and the plate line driver are arranged in the same position. An output signal of the wordline driver supplies a cell selection signal to the wordline WL of the cell. On the other hand, an output signal of the plate line driver supplies a driving signal to the plate line PL which is a driving line of the ferroelectric capacitor of the cell.

The boost voltage circuit and the decoder, as shown in FIG. 4, are formed at the upper edges of the left and right top cell arrays L and R and control the left and right top cell arrays and the left and right bottom cell arrays.

The boost voltage generating circuit for a nonvolatile ferroelectric memory device according to first and second embodiments of the present invention will now be described with reference to FIG. 6.

Figure 6:
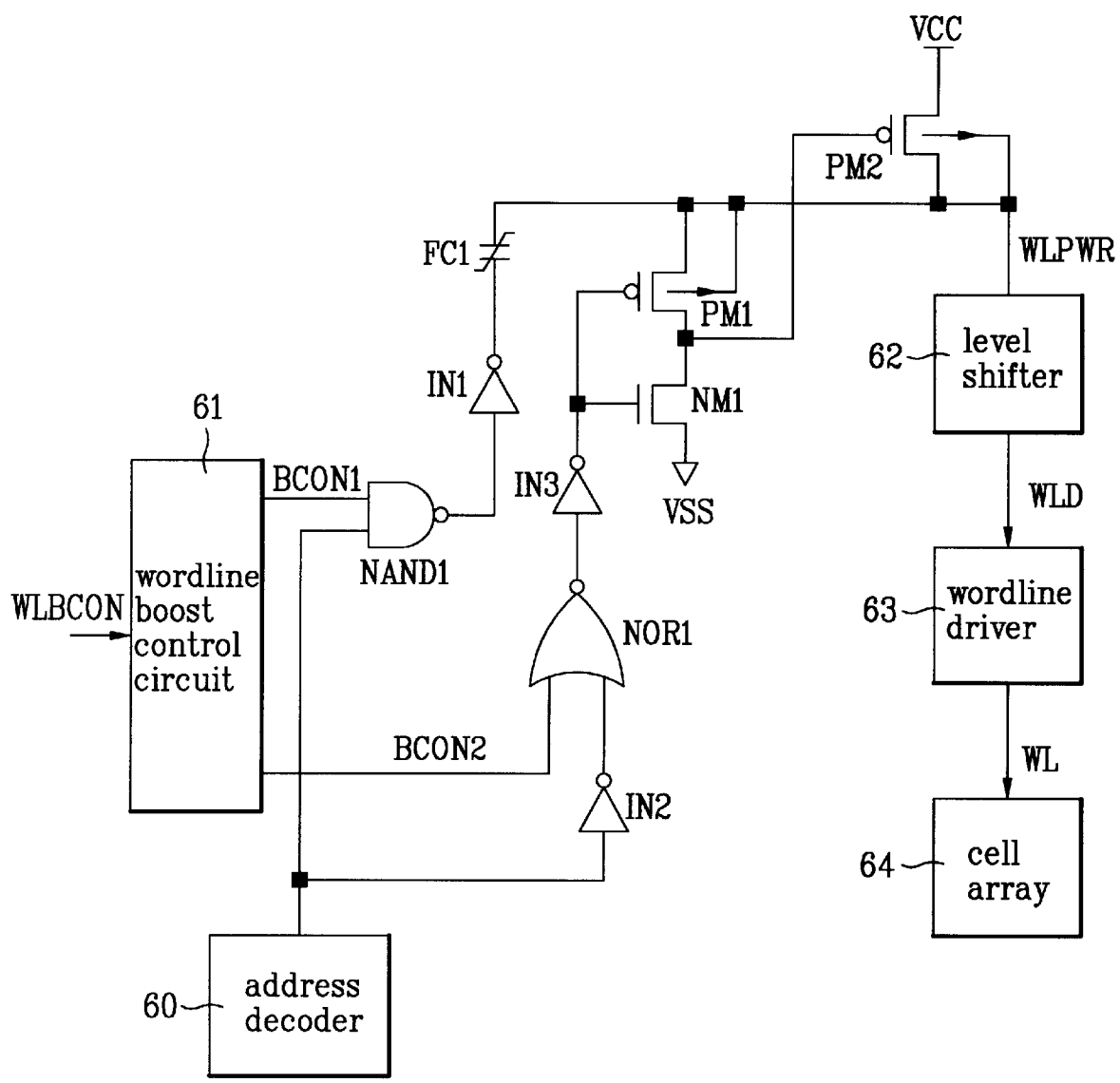
FIG. 6 is a circuit diagram of a wordline boost voltage generator for generating a wordline boost voltage according to a first embodiment of the present invention.
Figure 7:
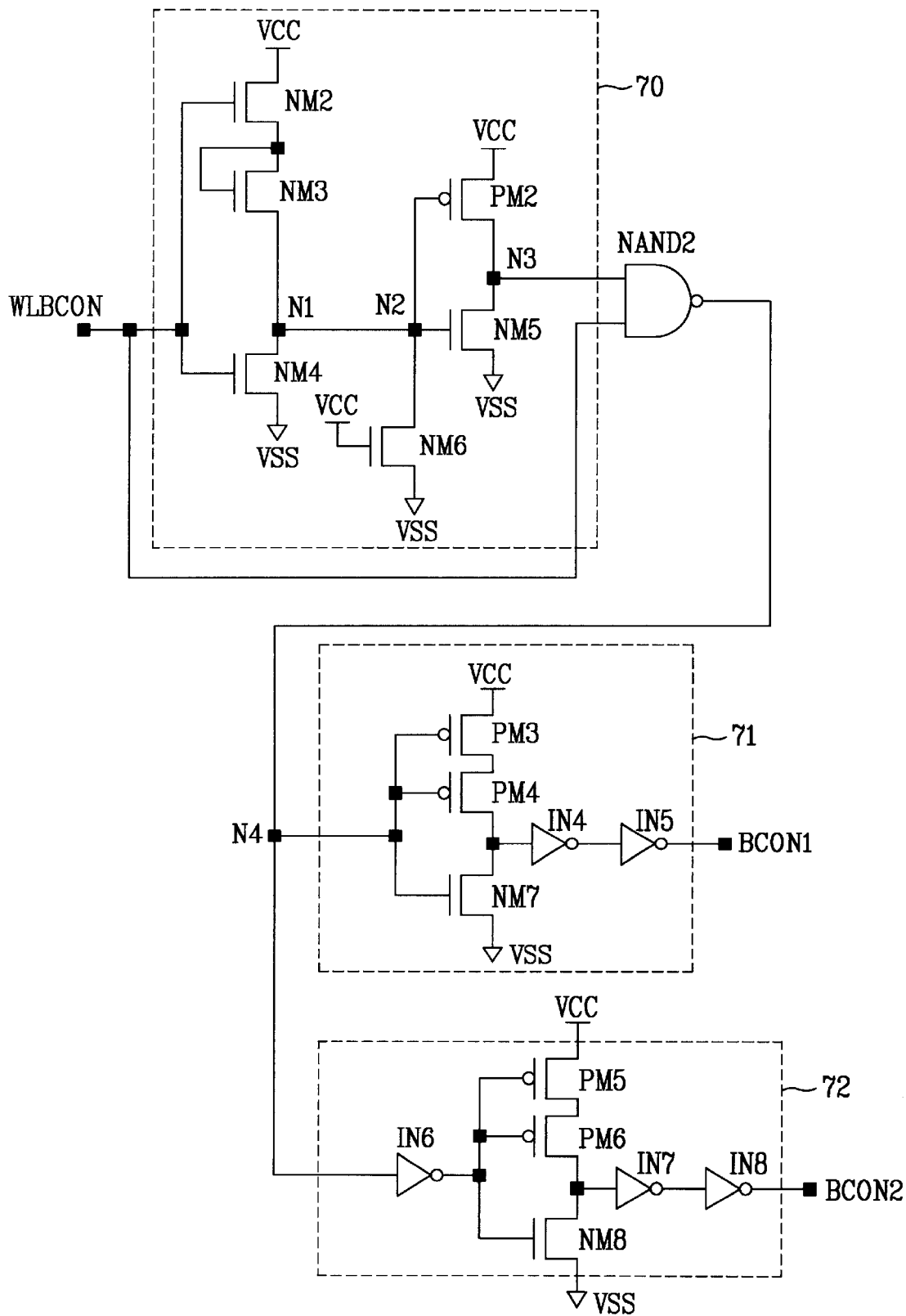
FIG. 7 is a circuit diagram of a wordline boost control circuit of FIG. 6.

FIG. 6 is a circuit diagram of a wordline boost voltage generating circuit for generating a wordline boost voltage according to the first embodiment of the present invention, while FIG. 7 is a circuit diagram of the wordline boost control circuit of FIG. 6.

The wordline boost voltage generating circuit according to the first embodiment of the present invention outputs a boost voltage to a wordline of a cell array 64 through a level shifter 62 and a wordline driver 63.

The wordline boost voltage generating circuit, as shown in FIG. 6, includes an address decoder 60, a wordline boost control circuit 61, a first NAND gate NAND1, a first inverter IN1, a second inverter IN2, a third inverter IN3, a first NOR gate NOR1, a first ferroelectric capacitor FC1, a CMOS inverter consisting of a first PMOS transistor PM1 and a first NMOS transistor NM1 and a second PMOS transistor PM2, a level shifter 62, a wordline driver 63, and a cell array 64.

More specifically, the address decoder 60 outputs an active signal of the corresponding address, while the wordline boost control circuit 61 receives a wordline boost control signal WLBCON and outputs first and second control signals BCON1 and BCON2 for controlling a reference point of a wordline boost point.

The WLBCON signal is generated by an active signal of a chip selection control signal CSBpad. The reference point of the wordline boost point is determined and controlled by the WLBCON signal.

The first NAND gate NAND1 performs a logic AND operation of the active signal of the address decoder 60 and the first control signal BCON1 of the wordline boost control circuit 61 and outputs the resultant value. The first inverter IN1 inverts an output of the first NAND gate NAND1. The first ferroelectric capacitor FC1 is disposed between the first inverter IN1 and the CMOS inverter.

The second inverter IN2 inverts the active signal output from the address decoder 60. The first NOR gate NOR1 performs a logic operation with the signal of the second inverter IN2 and the second control signal BCON2 and outputs the resultant value. The third inverter IN3 inverts the signal of the first NOR gate NOR1.

As described above, the CMOS inverter includes the first PMOS transistor PM1 and the first NMOS transistor NM1. The first PMOS transistor PM1 and the first NMOS transistor NM1 are operated between the first ferroelectric capacitor FC1 and a ground voltage terminal VSS in response to the signal of the third inverter IN3.

The second PMOS transistor PM2 is operated in response to the output signal of the CMOS inverter and is arranged between the power source voltage terminal VCC and the first ferroelectric capacitor FC1.

The level shifter 62 outputs a-wordline driver driving signal WLD in response to a wordline power signal WLPWR in accordance with the operation of the second PMOS transistor PM2, the first ferroelectric capacitor FC1, and the CMOS inverter.

The wordline driver 63 outputs a boosted or non-boosted wordline driving signal W/L in response to the wordline driver driving signal WLD shifted through the level shifter 62. The output of the wordline driving signal W/L is supplied to a cell array 64.

The wordline boost control circuit 61 for outputting the first and second control signals BCON1 and BCON2 to determine and control the reference point of the wordline boost point will be described below.

As described above, the wordline boost control circuit 61 outputs the first and second control signals BCON1 and BCON2 for controlling the final boost point of the wordline in response to the WLBCON signal.

As shown in FIG. 7, the wordline boost control circuit 61 includes a supply voltage sensing circuit 70, a second NAND gate NAND2 for executing a logic AND operation of the WLBCON signal and an output signal of the supply voltage sensing circuit 70 and inverting the resultant value, a first signal generator 71 for delaying a start edge signal of the WLBCON signal by a certain width and outputting the first control signal BCON1, and a second signal generator 72 for delaying an end edge signal of the WLBCON signal by a certain width and outputting the second control signal BCON2.

The supply voltage sensing circuit 70 will be described in more detail as follows.

A second NMOS transistor NM2 and a fourth NMOS transistor NM4 are arranged between the power source voltage terminal VCC and the ground voltage terminal VSS, and are operated in response to the WLBCON signal. A drain and a gate of a third NMOS transistor NM3 are connected between the second and fourth NMOS transistors NM2 and NM4. The third NMOS transistor NM3 serves to generate a voltage drop.

A CMOS inverter is arranged between the power source voltage terminal VCC and the ground voltage terminal VSS and includes a second PMOS transistor PM2 and a fifth NMOS transistor NM5. The second PMOS transistor PM2 and the fifth NMOS transistor NM5 are operated in response to a signal which is output through a contact node N1 between the third and fourth NMOS transistors NM3 and NM4 and is received at their gates.

A sixth NMOS transistor NM6 is arranged between a contact node N2 and the ground voltage terminal VSS to flow a certain current. The power source voltage VCC is applied to a gate of the sixth NMOS transistor NM6.

The first signal generator 71 includes a third PMOS transistor PM3, a fourth PMOS transistor PM4, and a seventh NMOS transistor NM7. The third PMOS transistor PM3, the fourth PMOS transistor PM4, and the seventh NMOS transistor NM7 are arranged between the power source voltage terminal VCC and the ground voltage terminal VSS. The first signal generator 71 is operated in response to the output signal of the second NAND gate NAND2, which is received at the gate of the first signal generator 71. The first signal generator 71 further includes a fourth inverter IN4 and a fifth inverter IN5 to delay a signal output through a contact node between the fourth PMOS transistor PM4 and the seventh NMOS transistor NM7.

At this time, the third and fourth PMOS transistors PM3 and PM4 serve to control a signal delay.

The second signal generator 72 includes a sixth inverter IN6, a fifth PMOS transistor PM5, a sixth PMOS transistor PM6, a seventh inverter IN7, and an eighth inverter IN8. The sixth inverter IN6 inverts the output signal of the second NAND gate NAND2. The fifth PMOS transistor PM5, the sixth PMOS transistor PM6, and the eighth NMOS transistor NM8 are sequentially arranged between the power source voltage terminal VCC and the ground voltage terminal VSS so that they are operated in response to the output signal of the sixth inverter IN6, which is received at their gates. The seventh and eighth inverters IN7 and IN8 serve to delay a signal output through a contact node between the sixth PMOS transistor PM6 and the eighth NMOS transistor NM8.

At this time, the fifth and sixth PMOS transistors PM5 and PM6 serve to control a signal delay.

The method for generating a boost voltage for a nonvolatile ferroelectric capacitor memory device according to a first embodiment of the present invention will now be described.

Operation of the wordline boost control circuit 61 will be described.

Figure 8:
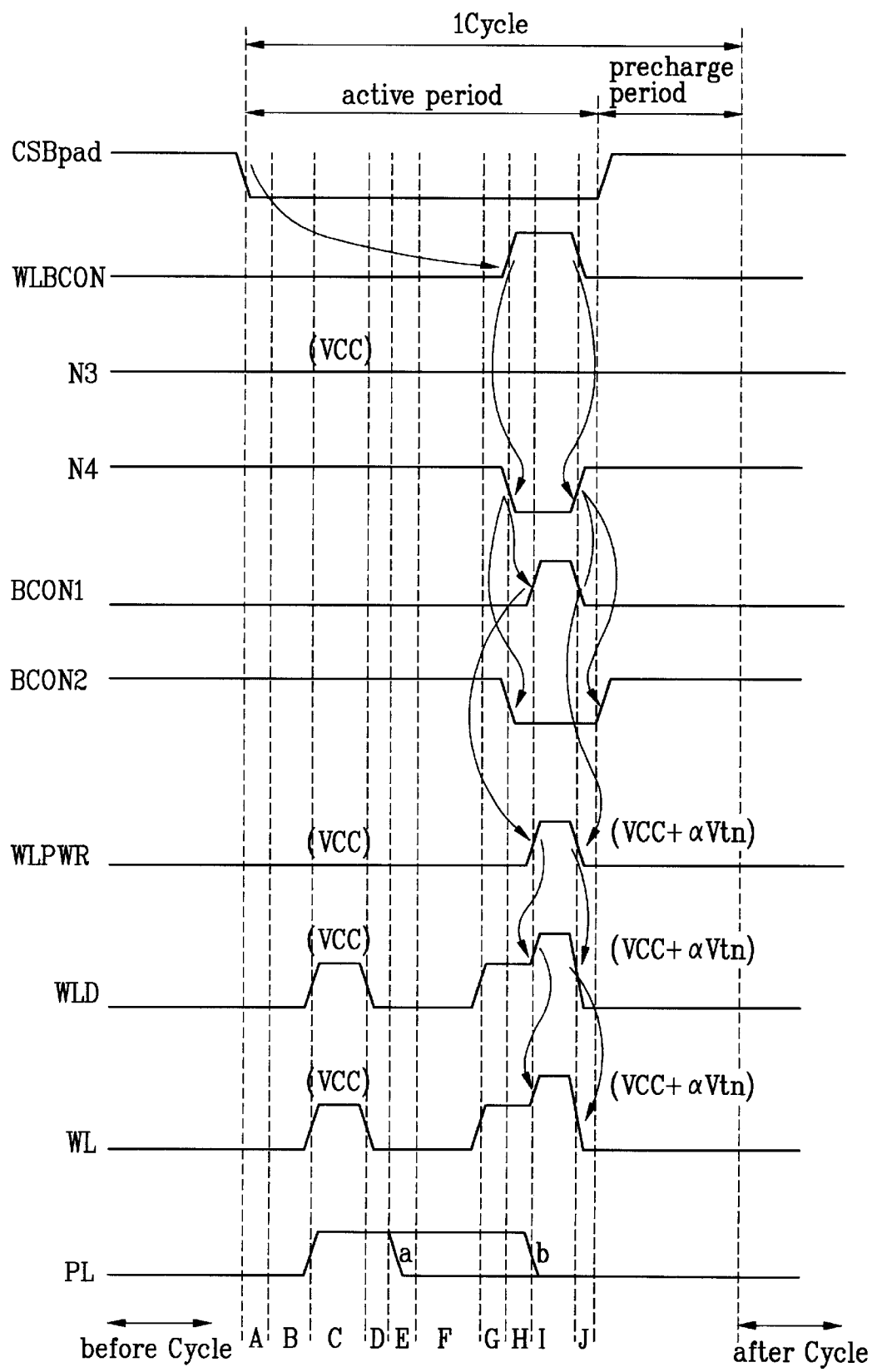
FIG. 8, is a driving timing chart of FIGS. 6 and 7 when a supply voltage is within a low voltage region.
Figure 9:
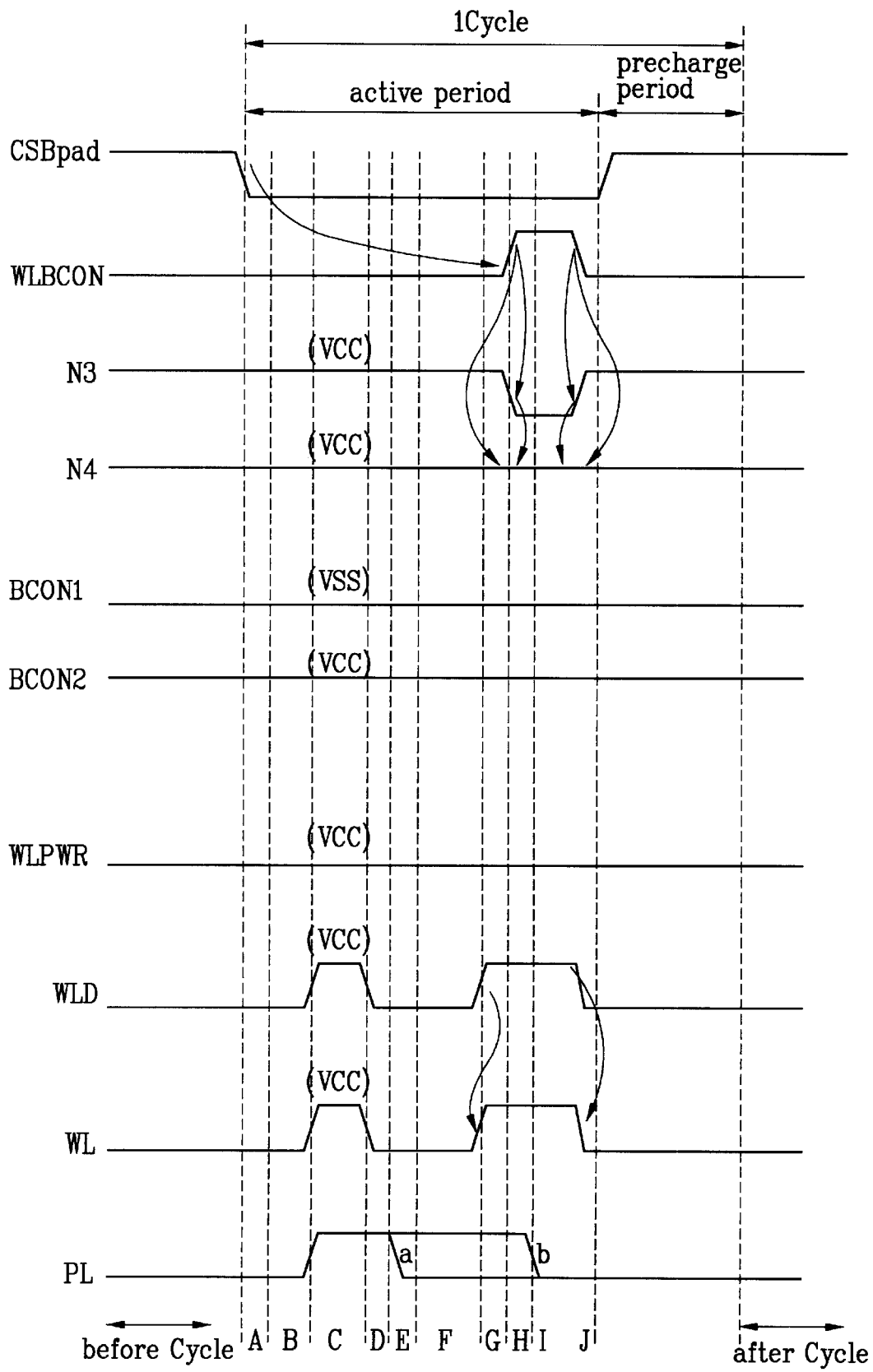
FIG. 9 is a driving timing chart of FIGS. 6 and 7 when a supply voltage is within a normal voltage region.

As shown in FIGS. 7, 8, and 9, if the WLBCON signal generates high pulse during the periods 'H' and 'I', a certain voltage dropped by the third NMOS transistor NM3 which is a voltage drop device is transmitted to a node N1.

At this time, a voltage of the node N1 is determined by a resistance ratio of the second through fourth NMOS transistors NM2, NM3, and NM4 to the sixth NMOS transistor NM6. Also, a voltage of a node N3 is determined by a resistance ratio of the second PMOS transistor PM2 to the fifth NMOS transistor NM5, the second PMOS transistor PM2 and the fifth NMOS transistor NM5 being driven by the voltage of the node N1.

At this time, if the voltage of the node N3 is greater than a logic threshold voltage Vt of the second NAND gate NAND2, it is determined that the power source voltage is less than a threshold voltage Vlimit (supply voltage is low voltage: FIG. 8). If the voltage of the node N3 is less than the logic threshold voltage Vt of the second NAND gate NAND2, it is determined that the power source voltage is greater than the threshold voltage Vlimit (supply voltage is normal voltage: FIG. 9).

At this time, the threshold voltage Vlimit is determined by the current driving capability of the NMOS and PMOS transistors in the supply voltage sensing circuit 70. In other words, the current driving capability depends on the size of the transistors.

Since the voltage of the node N1 is maintained at low level by the sixth NMOS transistor NM6 in a period where the WLBCON signal is low, the voltage of the node N3 is high level VCC and the second NAND gate NAND2 is activated. Thus, a signal of high level VCC is output through a node N4.

In case where the power source voltage is less than the threshold voltage Vlimit, as shown in FIG. 8, the node N3 is always maintained at high level. When the WLBCON signal is high level, a signal of low level is output from the node N4.

When a low signal is output through the node N4, a signal of a certain width (e.g., period 'H') at a start edge of the node N4 is delayed only through the first signal generator 71 to output the first control signal BCON1. A signal of a certain width at an end edge of the node N4 is delayed only through the second signal generator, 72 without delaying the start edge of the node N4 to output the second control signal BCON2.

At this time, the first control signal BCON1 is generated by the delay operation of the third and fourth PMOS transistors PM3 and PM4 and the fourth and fifth inverters IN4 and IN5 of the first signal generator 71. While the second control signal BCON2 is generated by the delay operation of the fifth and sixth PMOS transistors PM5 and PM6 and the seventh and eighth inverters IN7 and IN8 of the second signal generator 72.

The generated first and second control signals BCON1 and BCON2 are used as control signals of the wordline boost power generator of FIG. 6.

In case where the power source voltage is greater than the threshold voltage Vlimit, as shown in FIG. 9, the second node N3 is maintained at low level only when the WLBCON signal is High while the third node N3 and the second control signal BCON2 are always maintained at high level VCC. The first control signal BCON1 is always maintained at low level. The WLPWR signal is always output at high level through the wordline boost power generator which receives the first and second control signals and the output signal of the address decoder 60.

Therefore, the WLD and the WL are output at high level without being boosted.

Operation for outputting the wordline signal to the cell array 64 in response to the WLBCON signal, the first and second control signals BCON1 and BCON2, and the signal of the address decoder 60 will be described with reference to FIGS. 6 to 9.

When the power source voltage is less than the threshold voltage Vlimit, as shown in FIGS. 6 to 8, the WLPWR is boosted from VCC by a Vtn during the period 'I' of the active period, in which the first control signal BCON1 is High. The wordline driver driving signal WLD and the wordline signal WL are boosted from VCC to VCC +α Vtn through the level shifter 62 and the wordline driver 63.

Circuit operation in detail is as follows.

If the wordline boost control signal WLBCON is High during a certain period (periods 'H' and 'I') in the active period in which the chip enable signal CSBpad is activated at low level, the second node N3 of the supply voltage sensing circuit 70 outputs high level and its third node N4 outputs low level.

The signal of the start edge of the WLBCON is delayed only through the first signal generator 71, so that the first control signal BCON1 is output at high level during the period 'I' only. The signal of the end edge of the WLBCON is delayed only through the second signal generator 72, so that the second control signal BCON2 is output at low level during the periods 'H', 'I', and 'J'.

The first and second control signals are used as control signals of the wordline boost power generator of FIG. 6.

If a corresponding address is activated so that the address decoder 60 outputs a high signal, the first NAND gate NAND1 determines its output waveform in accordance with the first control signal BCON1.

Since a signal at one node of the first ferroelectric capacitor FC1 has the same waveform as that of the first control signal BCON1, it is output at low level if the first control signal BCON1 is Low while it is output high level if the BCON2 is High.

The first NOR gate NOR1 operates the inverted signals of the second control signal BCON2 and the signal of the address decoder 60.

The first PMOS transistor PM1 and the second PMOS transistor PM2 use the same N well as each other. The N well used for the first PMOS transistor PM1 and the second PMOS transistor PM2 is different from that for the other PMOS transistors. Also, as a power source, the WLPWR is supplied to the N well of the first and second PMOS transistors unlike the other PMOS transistors. The external power source VCC is supplied to the N well of the other PMOS transistors.

The power supply source WLPWR of the level shifter 62 shows either VCC or a voltage VCC+α Vtn boosted from the VCC. The power supply source WLPWR is determined by controlling the first and second control signals BCON1 and BCON2.

In other words, when the first control signal BCON1 is Low and the second control signal is High, one end of the first ferroelectric capacitor FC1 is maintained at low level. As the first NMOS transistor NM1 is turned on, the second PMOS transistor PM2 is turned on.

Thus, the WLPWR becomes the same as the VCC, and the first ferroelectric capacitor FC1 is charged with VCC. Before the WLPWR is boosted, the second control signal BCON2 is transited to low level so that the second PMOS transistor PM2 is turned off.

After the second PMOS transistor PM2 is turned off, the first control signal BCON1 is transited to high level so that the WLPWR generates a boosted voltage by means of the charge of the first ferroelectric capacitor FC1.

After the WLPWR is boosted, the first control signal BCON1 is transited to low level to allow the boosted power source to charge the first ferroelectric capacitor FC1. Then, the second control signal BCON2 is transited to high level so that the WLPWR becomes VCC again.

The WLPWR is used as a driving power source of the level shifter 62, the WLD output through the level shifter 62 is used as a driving power source of the wordline driver 63. The wordline signal WL output through the wordline driver 63 is supplied to the wordline of the cell array 64.

The WLD signal shows a boosted waveform in the period 'I' in response to the-WLPWR signal. Thus, the WL also shows a boosted voltage in the period 'I'.

The plate line PL is transited to high level VCC at the start point in which the wordline WL is first at high level. The plate line PL may be transited to low level at the point where the first high level ends or in any period before the second high level is boosted after it is generated. That is to say, the plate line PL may be transited to low level at any point of the periods 'E', 'F', 'G', and 'H' of FIG. 8.

The method for driving the wordline based on the wordline boost power generator of FIG. 6 will be described below.

When the external power source voltage is higher than the threshold voltage, as shown in FIGS. 6, 7, and 9, the WLPWR signal becomes the same as VCC without being boosted at any period. Therefore, the WLD signal and the WL signal output a normal power source voltage VCC.

Also, in the active period in which the chip enable signal CSBpad is transited to low level, if the WLBCON signal is output at high level during the periods 'H' and 'I', a low signal is output through the node N3 during the periods 'H' and 'I'.

The signal of the node N4, the second control signal BCON2 and the WLPWR signal continue to show high level VCC while the first control signal BCON1 shows low level VSS.

The plate line PL is transited to high level VCC at the start point in which the wordline WL is first at high level. The plate line may be transited to low level at the point where the first high level ends or in any period before the second high level is transited to low level after it is generated. That is to say, the plate line PL may be transited to low level at any point of the periods 'E', 'F', 'G', and 'H' of FIG. 8.

The boost voltage generating circuit for a nonvolatile ferroelectric memory device according to a second embodiment of the present invention will now be described.

In the second embodiment of the present invention, the boost voltage is to be transmitted to a gate of a self-boost NMOS transistor of the wordline driver.

Figure 10:
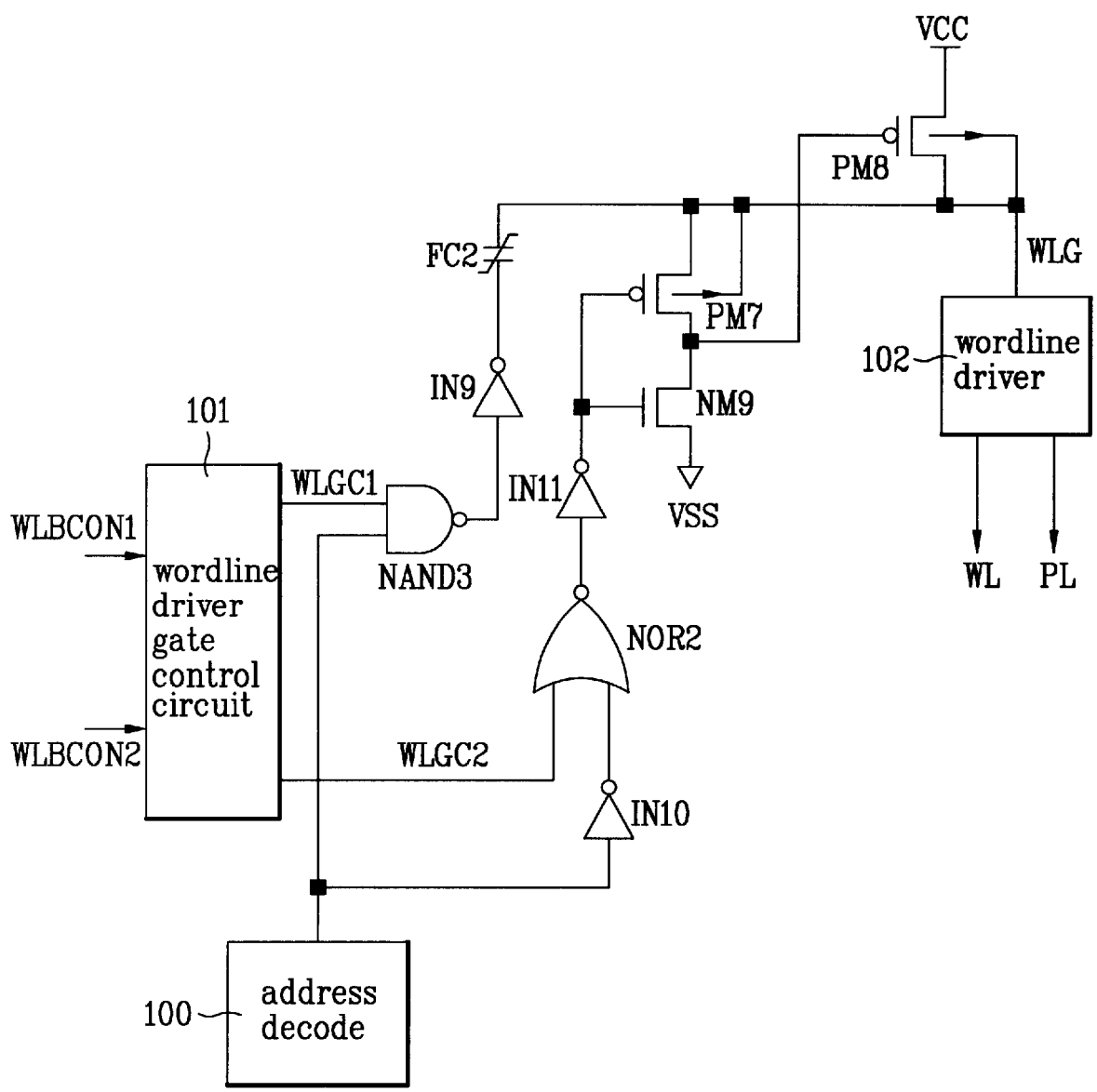
FIG. 10 is a circuit diagram of a wordline driver gate boost power generator for generating a wordline boost voltage according to a second embodiment of the present invention.
Figure 11:
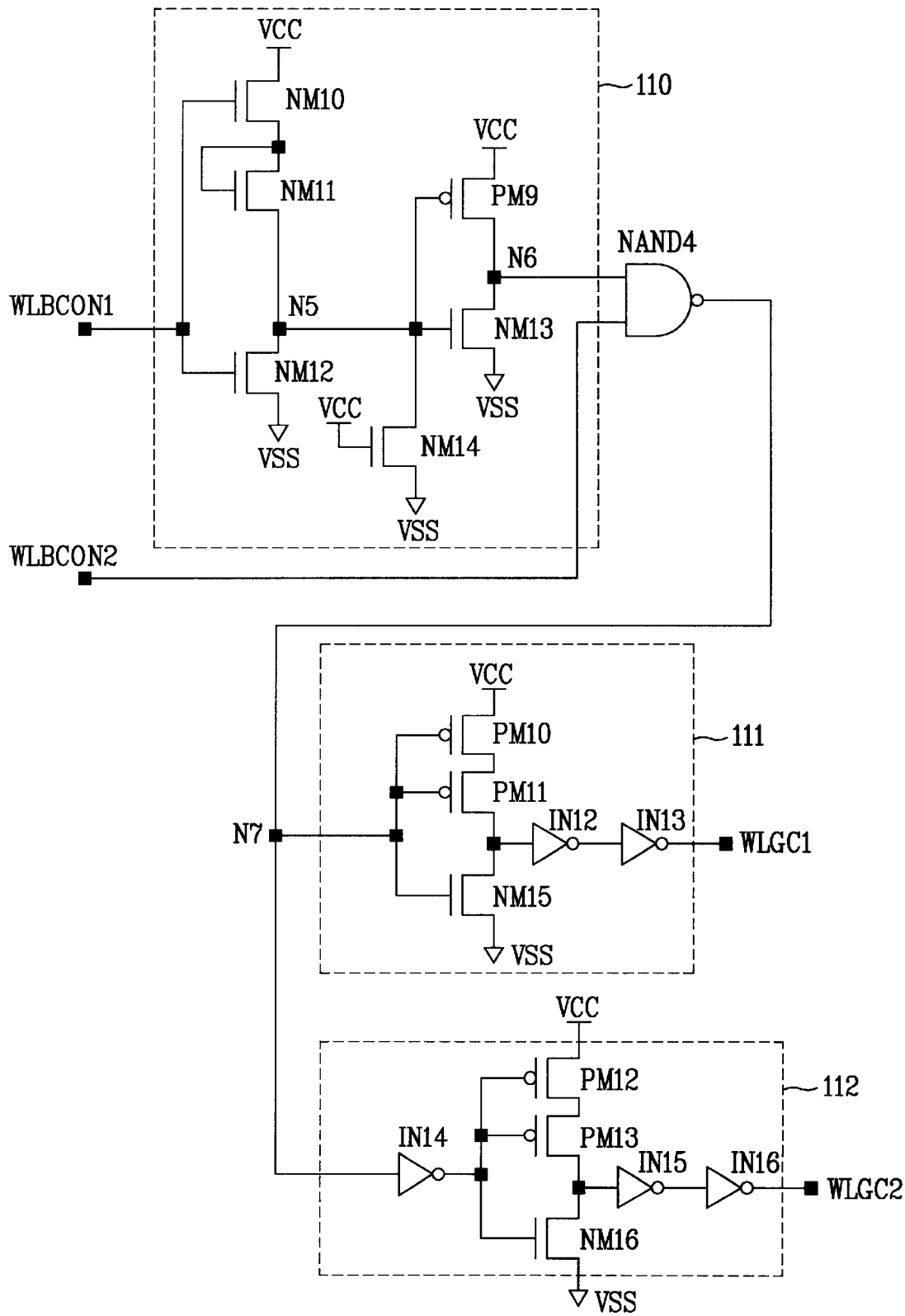
FIG. 11 is a circuit diagram of a wordline driver gate control circuit for controlling the wordline driver gate boost power generator of FIG. 10.

FIG. 10 is a circuit diagram of a wordline driver gate boost power generator for generating a boost voltage according to the second embodiment of the present invention. FIG. 11 is a circuit diagram of a wordline driver gate control circuit for controlling the wordline driver gate boost power generator of FIG. 10.

The wordline driver gate boost power generator, as shown in FIG. 10, includes a similar structure as that of FIG. 6 except that the wordline boost control circuit 61 is replaced with a wordline driver gate control circuit 101, the first and second control signals BCON1 and BCON2 and the WLPWR signal are respectively replaced with WLGC1, WLGC2, and WLG, and the level shifter 62 is not provided.

The WLGC1 and WLGC2 signals are referred to as first and second wordline driver gate control signals.

A supply voltage sensor 110 and third and fourth signal generators 111 and 112 of the wordline driver gate control circuit 101 shown in FIG. 11 are operated in the same manner as the supply voltage sensing circuit 70, the first signal generator 71, and the second signal generator 72, respectively, as shown in FIG. 7.

In FIGS. 6 and 7, the wordline boost control circuit is driven by the wordline boost control signal. In FIGS. 10 and 11, the wordline driver gate control circuit is driven by the wordline boost control signals WLBCON1 and WLBCON2, and the fourth NAND gate NAND4 is operated by the node N6 and the wordline boost control signal WLBCON2.

Figure 12:
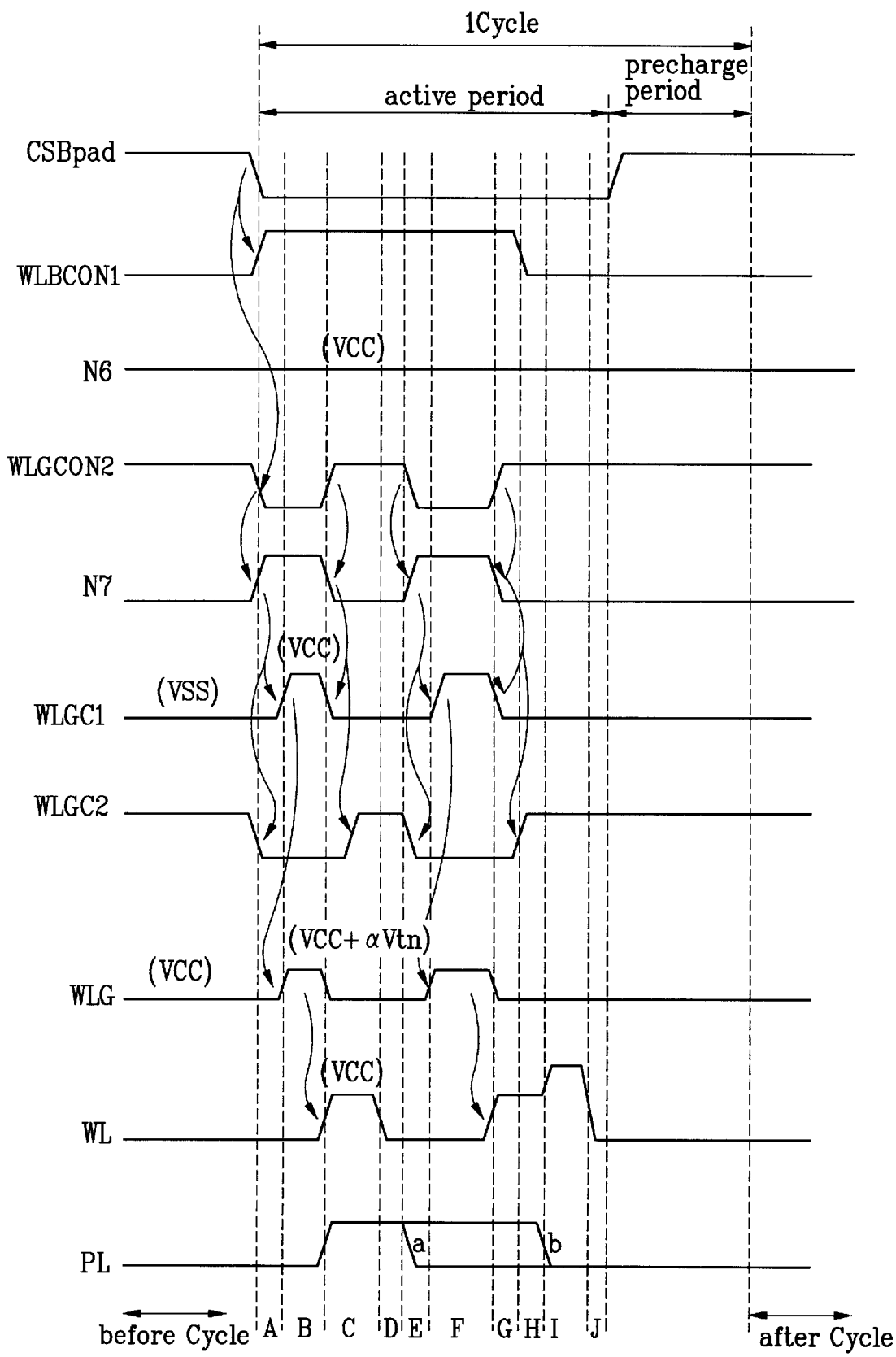
FIG. 12 is a driving timing chart of FIGS. 10 and 11 when a supply voltage is within a low voltage region.

The output node N6 of the supply voltage sensor 110, as shown in FIG. 12, is maintained at high level at a voltage less than the threshold voltage Vlimit.

An output waveform of the fourth NAND gate NAND4 is determined by the signal WLBCON2, while the signals WLGC1 and WLGC2 are determined by the output waveform of the fourth NAND gate NAND4.

In other words, the signal WLGC1 shown in FIG. 12 is a waveform in which a start edge of the signal WLGCON2 having low level is only delayed, while the signal WLGC2 is a waveform in which a width of an end edge of the signal WLGCON2 having low level is further delayed.

Operation of each element of FIG. 11 is similar to the operation of each element of FIG. 7 as described above.

The boost operation principle of the signal WLG in FIGS. 10 and 12 is similar to the boost operation principle of the signal WLPWR in FIGS. 6 and B.

The signal WLGC1 generates high pulse during the period in which the signal WLGC2 is in low pulse so that the charges stored in the second ferroelectric capacitor FC2 boost the WLG signal voltage during the periods 'B' and 'F'.

Afterwards, if the boosted WLG signal is transited to the external power source level VCC, the wordline WL signal is activated.

Figure 13:
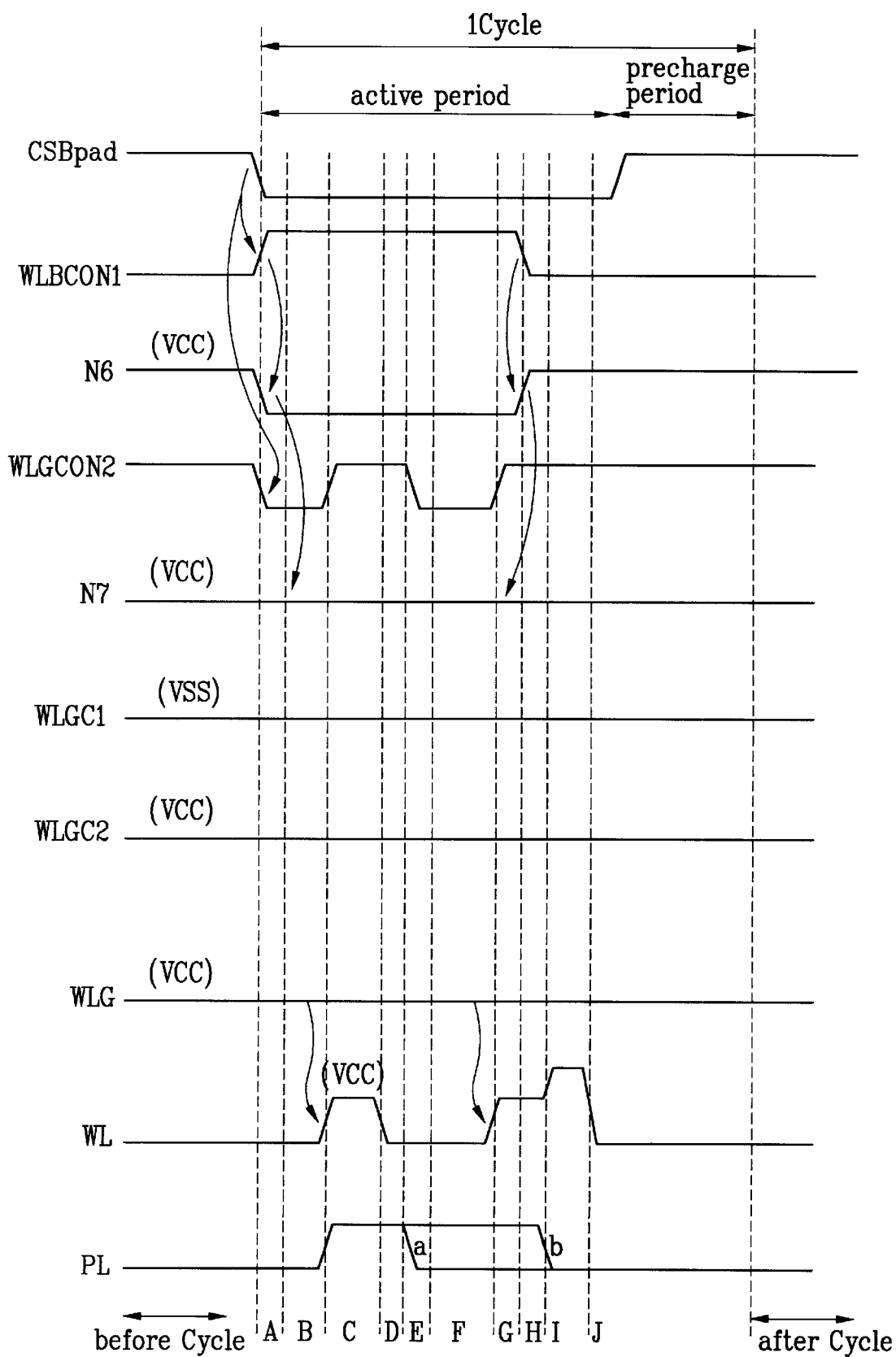
FIG. 13 is a driving timing chart of FIGS. 10 and 11 when a supply voltage is within a normal voltage region.

As shown in FIGS. 10, 11, and 13, if the power source voltage is greater than the threshold voltage Vlimit, the signal of low level is output through the node N6 during the period in which the signal WLGCON1 is High.

If the node N6 is low level at the threshold voltage or greater, a signal of a node N7 which is an output terminal of the fourth NAND gate NAND4, the signal .WLGC2, and the signal WLG are maintained at high level regardless of the signal WLBCON2 while the signal WLGC1 is maintained at low level (VSS).

As described above, when the power source voltage is greater than the threshold voltage, the signal WLG is maintained at high level VCC without generating a boost voltage.

The wordline/plate line driver circuit of FIGS. 4 and 5 will be described with reference to FIG. 14.

Figure 14:
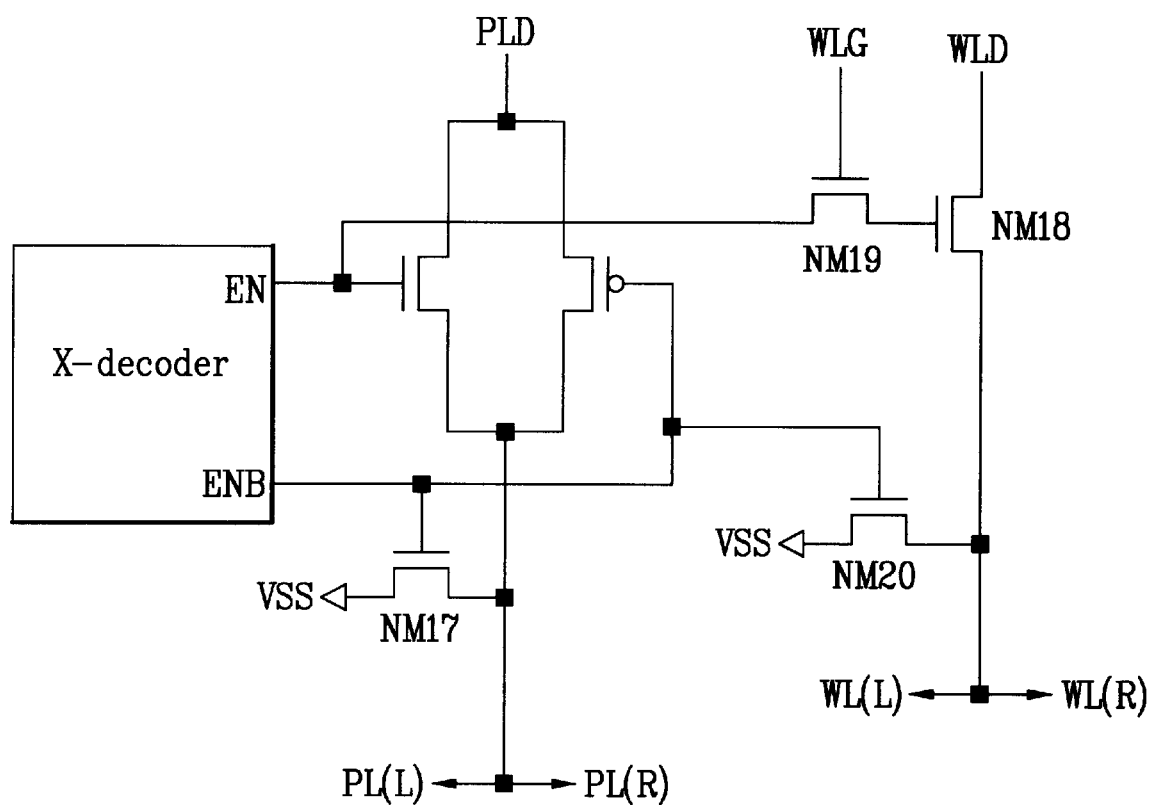
FIG. 14 is a circuit diagram of a wordline/plate line driver of FIGS. 4 and 5.

As shown in FIG. 14, the wordline/plate line driver includes an X-decoder which is a row selection decoder, a transfer gate consisted of an NMOS transistor and a PMOS transistor, for transferring a plate line driving signal PLD to a plate line PL(L or R), a seventeenth NMOS transistor NM17 arranged between other end of the transfer gate and a ground voltage terminal, for receiving a disable signal ENB at a gate, an eighteenth NMOS transistor NM18 acting as a switching function to transfer the wordline driver driving WLD signal to the wordline, a ninth NMOS transistor NM19 for controlling the switching operation of the eighteenth NMOS transistor NM18 in response to the wordline driver gate control WLG signal, and a twentieth NMOS transistor NM20 arranged between the wordline WL and the ground voltage terminal VSS, for receiving the disable signal ENB of the X-decoder.

The transfer gate is driven in response to the enable signal EN of the X-decoder in the NMOS transistor and the disable signal ENB in the PMOS transistor, and is to transfer the plate line driving PLD signal to the left or right plate line PL(L) or PL(R).

The ninth NMOS transistor NM19 serves to transmit the enable signal EN of the X-decoder to a gate of the eighteenth NMOS transistor. The X-decoder is commonly used for the wordline and the plate line.

Operation of the wordline/plate line driver will be described below.

If a corresponding row address is activated, the enable signal EN is output at high level and the disable signal ENB is output at low level. When the enable signal of the X-decoder is output at high level, a voltage of a gate node of the eighteenth NMOS transistor is determined by the state of a voltage of the WLG. In other words, the voltage of the gate node of the eighteenth NMOS transistor NM18 represents WLG α Vtn, wherein Vtn is a threshold voltage of the NMOS transistor and α has a value of 1.0 or greater.

Therefore, in case of low voltage operation, if the voltage of the gate node of the eighteenth NMOS transistor NM18 is too low, that is, if it is lower than the threshold voltage of the eighteenth transistor NM18, the eighteenth NMOS transistor NM18 is turned off. In this case, the WLD signal is not transmitted to the wordline.

On the contrary, if the WLG signal is High, the enable signal of the X-decoder is transmitted to the gate node of the eighteenth NMOS transistor NM18 so that the eighteenth NMOS transistor NM18 is turned on. In this case, the WLD signal is transmitted to the wordline.

The column selector of FIGS. 4 and 5 will now be described with reference to FIG. 15.

Figure 15:
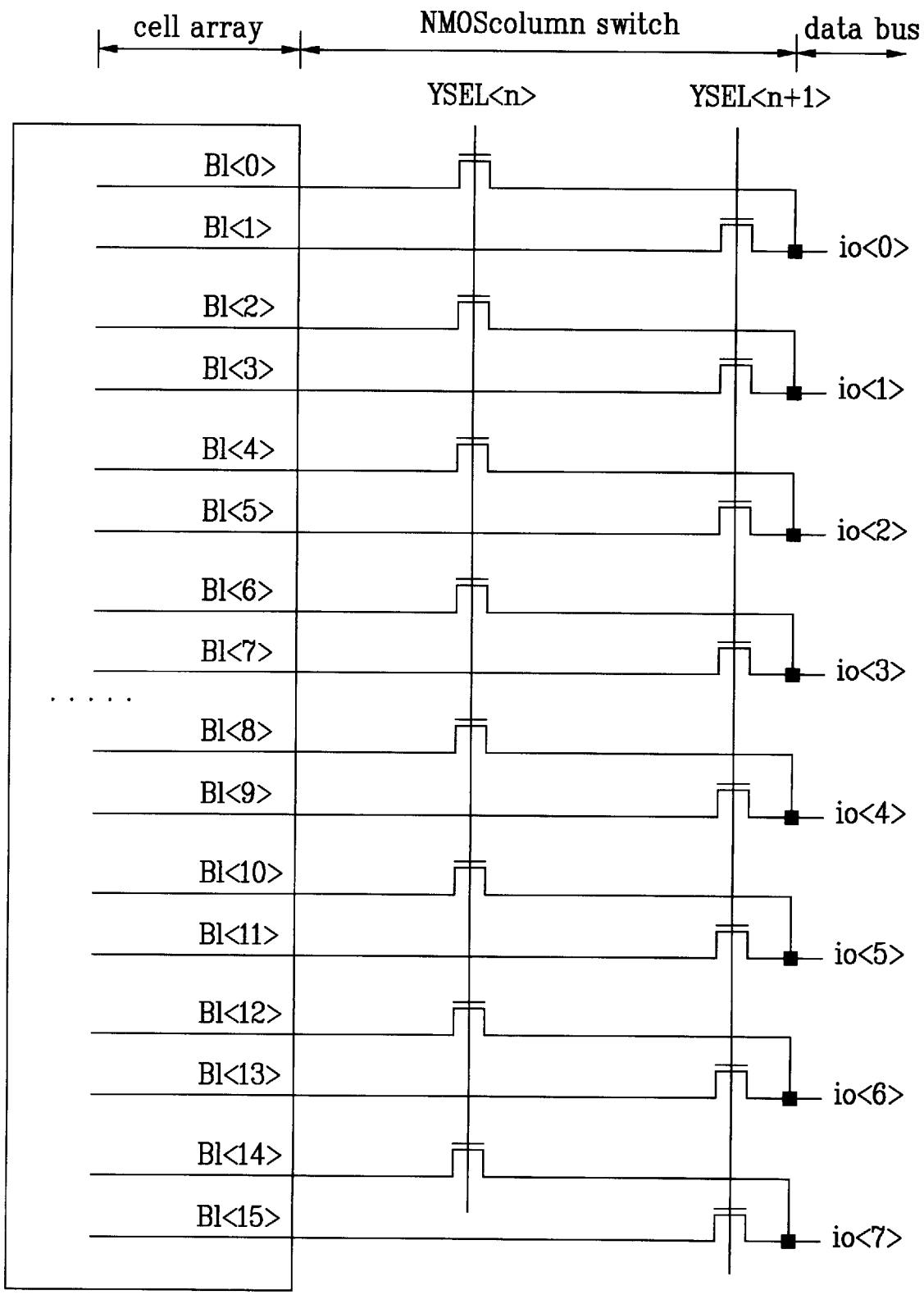
FIG. 15 is a circuit diagram of a column selector of FIGS. 4 and 5.

FIG. 15 is a circuit diagram illustrating the column selector of FIGS. 4 and 5.

As shown in FIG. 15, the column selector includes two NMOS transistors which perform switching operation by respectively receiving first and second, selection signals YSEL<n> and YSEL<n+1>, so that data of a data bus io<m> (m represents an integer within the range of $0 \leq m \leq 7$.) are transmitted to a bitline Bl<x> or Bl<x+1> (x represents an integer within the range of $0 \leq x \leq 14$.).

In other words, the column selector is configured in such a manner that two bitlines are connected to the data bus and the two NMOS transistors are operated under the control of the first and second selection signals YSEL<n> and YSEL<n+1> to select one of the two bitlines. Such a unit arrangement of the column selector is repeated in this embodiment.

The NMOS transistor controlled by the first selection signal YSEL<n> is arranged per first (or odd numbered) bitline while the NMOS transistor controlled by the second selection signal YSEL<n+1>is arranged per second (or even numbered) bitline, so that the respective NMOS transistors are alternately arranged per bitline.

As described above, two bitlines controlled by the selection signals YSEL<n> and YSEL<n+1> are connected with one io<m>, so that the processing layout of io<0> bus is improved.

The boost voltage generating circuit for a nonvolatile ferroelectric memory device and the method of generating the boost voltage according to the present invention has the following advantages.

The voltage VCC+α Vtn higher than the power source voltage VCC is generated in the low power source voltage region (where the power source voltage is less than the threshold voltage) by using the ferroelectric capacitor. Thus, it is supplied to the self-boost NMOS transistor of the wordline and the wordline driver of the cell, thereby boosting the wordline. In this case, the stable operation of the (ell is performed in the present invention.

When the power source voltage is within a normal region, the cell is operated using the power source voltage VCC only. Thus, the CMOS device is not deteriorated by the high voltage.

Furthermore, since the boost voltage is generated by using the ferroelectric capacitor, an area of the boost capacitor is substantially reduced. In this case, since a layout area is reduced, the chip cost is also reduced.

It will be apparent to those skilled in the art that various modifications and variations can be made in the boost voltage generating circuit for a nonvolatile ferroelectric memory device and method of generating a boost voltage of the present invention without departing from the spirit or scope of the inventions. Thus, it is intended that the present invention covers the modifications and variations of this invention provided they come within the scope of the appended claims and their equivalents.

What is claimed is:

1. A boost voltage generating circuit for a nonvolatile ferroelectric memory device, comprising:

a supply voltage sensor receiving a voltage boost control signal and determining whether a power source voltage is less than a threshold voltage;

a first operation unit receiving an output signal of the supply voltage sensor and the voltage boost control signal and performing a first logic operation;

first and second signal output units receiving an output signal of the first operation unit and delaying start and end edges of the voltage boost control signal, thereby outputting first and second boost control signals; and a voltage generating circuit having a ferroelectric capacitor that receives an active signal of an address decoder and the first and second boost control signals when the power source voltage is less than the threshold voltage, thereby generating a boost voltage higher than the power source voltage.

2. The boost voltage generating circuit of claim 1, wherein the voltage boost control signal includes a single signal that controls both the supply voltage sensor and the first operation unit.

3. The boost voltage generating circuit of claim 1, wherein the voltage boost control signal includes two signals having a first voltage boost control signal for controlling the supply voltage sensor only and a second voltage boost control signal for controlling the first operation unit only.

4. The boost voltage generating circuit of claim 1, wherein the voltage generating circuit comprises:

a second operation unit receiving the first boost control signal and the active signal of the address decoder and performing a second logic operation;

a first inverter inverting an output signal of the second operation unit;

a second inverter inverting the active signal of the address decoder;

a third operation unit receiving the second boost control signal and an output signal of the second inverter and performing a third logic operation;

a third inverter inverting an output signal of the third operation unit;

a first CMOS inverter inverting an output signal of the third inverter; and a first PMOS transistor receiving an output signal of the first CMOS inverter, wherein the ferroelectric capacitor having a first end connected to the first inverter and a second end connected to the first CMOS inverter.

5. The boost voltage generating circuit of claim 4, wherein the first PMOS transistor is connected to a power source voltage terminal and the ferroelectric capacitor.

6. The boost voltage generating circuit of claim 4, wherein the first CMOS inverter has a second PMOS transistor, wherein the first and second PMOS transistors are formed at the same N well.

7. The boost voltage generating circuit of claim 1, wherein the supply voltage sensor includes:

first and third NMOS transistors receiving the voltage boost control signal and arranged between a power source voltage terminal and a ground voltage terminal;

a second NMOS transistor coupled to the first and third NMOS transistors and generating a voltage drop;

a second CMOS inverter arranged between the power source voltage terminal and the ground voltage terminal and receiving a signal through a contact node between the second and third NMOS transistors; and a fourth NMOS transistor arranged between the contact node of the second and third NMOS transistors and the ground voltage terminal and receiving the power source voltage.

8. The boost voltage generating circuit of claim 1, wherein the first signal generator includes:

a second PMOS transistor, a third PMOS transistor, and a fifth NMOS transistor sequentially arranged between the power source voltage terminal and the ground voltage terminal and receiving the output signal of the first operation unit; and fourth and fifth inverters serially arranged and delaying a signal through a contact node between the third PMOS transistor and the fifth NMOS transistor.

9. The boost voltage generating circuit of claim 1, wherein the second signal output unit includes:

a sixth inverter inverting the output signal of the first operation unit;

a fourth PMOS transistor, a fifth PMOS transistor, and a sixth PMOS transistor sequentially arranged between the power source voltage terminal and the ground voltage terminal and receiving an output signal of the sixth inverter; and seventh and ninth inverters serially arranged and delaying a signal through a contact node between the fifth PMOS transistor and the sixth PMOS transistor.

10. The boost voltage generating circuit of claim 1, further comprising a level shifter and a wordline driver to transmit the boost voltage higher than the power source voltage to a cell array.

11. The boost voltage generating circuit of claim 1, comprising a wordline/plate line driver to transmit the boost voltage higher than the power source voltage to a wordline driver.

12. The boost voltage generating circuit of claim 11, wherein the wordline/plate line driver comprises:

an X-decoder which is a row selection decoder;

a transfer gate transferring a plate line driving signal to a plate line, the transfer gate having an NMOS transistor and a PMOS transistor;

a seventh NMOS transistor arranged between the transfer gate and a ground voltage terminal and receiving a disable signal from the X-decoder;

an eighth NMOS transistor acting as a switching function to transfer the wordline driver driving signal to the wordline;

a ninth NMOS transistor receiving the boost voltage higher than the power source voltage and controlling the switching operation of the eighth NMOS transistor; and a tenth NMOS transistor arranged between the wordline and the ground voltage terminal and receiving the disable signal from the X-decoder.

13. The boost voltage generating circuit of claim 1, wherein the voltage boost control signal is generated during an active period when a chip enable signal is activated.

14. A method of generating a boost voltage for a non-volatile ferroelectric memory device, comprising:

outputting a voltage boost control signal when a chip enable signal is activated in a region where a power source voltage is less than a threshold voltage;

delaying start and end edges of the voltage boost control signal to output first and second boost control signals; and inputting the first and second boost control signals into a boost voltage generating circuit having a ferroelectric capacitor to generate a boost voltage higher than the power source voltage.

15. The method of claim 14, wherein the voltage boost control signal is output at high level to control a wordline boost control signal.

16. The method of claim 14, wherein the voltage boost control signal includes:

a first voltage boost control signal of high level having a first width to control a wordline driver gate control circuit; and a second voltage boost control signal in the order of low level, high level, and low level with a second width while the first voltage boost control signal is output at high level.

17. The method of claim 14, wherein the first boost control signal is output at high level by delaying the start edge only when the voltage boost control signal is output at high level.

18. The method of claim 14, wherein the second boost control signal is output at low level by delaying/extending a width equivalent to the end edge when the voltage boost control signal is output at high level.

19. The method of claim 14, wherein the first boost control signal is output at high level by delaying the start edge only when the second voltage boost control signal is output at low level.

20. The method of claim 14, wherein the second boost control signal is output at low level by delaying/extending a width equivalent to the end edge when the second voltage boost control signal is output at low level.

21. The method of claim 14, wherein the boost voltage higher than the power source voltage is output to a wordline of a cell array block through a level shifter and a wordline driver or is transferred to a gate of a self-boost NMOS transistor of the wordline driver.

22. A method of generating a boost voltage for a non-volatile ferroelectric memory device, comprising:

outputting a wordline boost control signal of high level having a first width when a chip enable signal is activated and a power source voltage is less than a threshold voltage;

delaying only a start edge of the wordline boost control signal to output a first boost control signal;

outputting the first boost control signal and at the same time delaying/extending a width equivalent to an end edge of the boost control signal to output a second boost control signal; and inputting an active signal of an address decoder and the first and second boost control signals in a boost voltage generating circuit having a ferroelectric capacitor to generate a boost voltage higher than the power source voltage.

23. The method of claim 22, wherein the boost voltage higher than the power source voltage is output to the wordline of a cell array block through a level shifter and a wordline driver.

24. A method of generating a boost voltage for a non-volatile ferroelectric memory device, comprising:

outputting a first voltage boost control signal of a wordline driver of high level having a first width when a chip enable signal is activated in a region where a power source voltage is less than a threshold voltage;

outputting a second voltage boost control signal in the order of low level, high level, and low level while the first voltage boost control signal is output at high level;

delaying only a start edge of the second voltage boost control signal to output a first boost control signal at high level;

outputting the first boost control signal and at the same time delaying/extending a width equivalent to an end edge of the second voltage boost control signal to output a second boost control signal at low level; and inputting an active signal of an address decoder and the first and second boost control signals in a boost voltage generating circuit having a ferroelectric capacitor to generate a boost voltage higher than the power source voltage only when the first boost control signal is high level.

25. The method of claim 24, wherein the boost voltage higher than the power source voltage is applied to a self-boost NMOS transistor of a wordline driver for controlling transfer of a wordline driving signal to a wordline of a cell array block.

26. The method of claim 24, wherein the boost voltage higher than the power source voltage is generated before a high pulse is generated in a wordline of a cell array block.

* * * * *